(12) United States Patent
Baik et al.

(10) Patent No.: US 8,188,799 B2
(45) Date of Patent: May 29, 2012

(54) MICROELECTROMECHANICAL SYSTEM DEVICE AND METHOD OF MANUFACTURING THE MICROELECTROMECHANICAL SYSTEM DEVICE

(75) Inventors: Chan-wook Baik, Yongin-si (KR); Seog-woo Hong, Yongin-si (KR); Hwan-soo Suh, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 12/801,964

(22) Filed: Jul. 6, 2010

(65) Prior Publication Data

US 2011/0156830 A1   Jun. 30, 2011

(30) Foreign Application Priority Data

Dec. 31, 2009   (KR) .................. 10-2009-0136216

(51) Int. Cl.
*H01P 7/06* (2006.01)
*H03B 5/18* (2006.01)
*H03B 7/12* (2006.01)
*H03B 7/14* (2006.01)

(52) U.S. Cl. ......................................... 331/96; 333/227

(58) Field of Classification Search ................ 331/96, 331/107 DP, 117 D, 154; 333/219, 227
See application file for complete search history.

(56) References Cited

U.S. PATENT DOCUMENTS 6,544,863 B1   4/2003   Chong et al.

FOREIGN PATENT DOCUMENTS

| JP | 2007145641 A * | 6/2007 |
|---|---|---|
| KR | 10-2003-0021033 | 3/2003 |
| KR | 10-2004-0086679 | 10/2004 |
| KR | 10-2007-0074593 | 7/2007 |
| KR | 10-2007-0114456 | 12/2007 |
| KR | 10-2009-0011222 | 2/2009 |
| KR | 10-2009-0048186 | 5/2009 |

* cited by examiner

*Primary Examiner* — David Mis
(74) *Attorney, Agent, or Firm* — Harness, Dickey & Pierce (57) ABSTRACT

Provided is a microelectromechanical system (MEMS) that includes a first structure and second structure. The first structure and second structure may each include a first substrate and a second substrate. The first substrate of each structure may have first and second surfaces that face each other. The first substrate may include a via etching hole pattern penetrating the first surface and the second surface and a first non-via etching hole pattern penetrating the first surface. The second substrate of each structure may have third and fourth surfaces that face each other. The second substrate may include a second non-via etching hole pattern penetrating the third surface in a position corresponding to the via etching hole pattern of the first substrate. In the microelectromechanical system (MEMS) the second surface of the first substrate and the third surface of the second substrate may be bonded together.

19 Claims, 10 Drawing Sheets

MICROELECTROMECHANICAL SYSTEM DEVICE AND METHOD OF MANUFACTURING THE MICROELECTROMECHANICAL SYSTEM DEVICE

CROSS-REFERENCE TO RELATED APPLICATIONS

This application claims priority under 35 U.S.C. §119 to Korean Patent Application No. 10-2009-0136216, filed on Dec. 31, 2009, in the Korean Intellectual Property Office (KIPO), the entire contents of which are herein incorporated by reference.

BACKGROUND

1. Field

Example embodiments of inventive concepts relate to a microelectromechanical system (MEMS) manufactured by using a substrate etching and bonding method, and more particularly, to a MEMS for a terahertz oscillator manufactured by bonding a plurality of etched substrates.

2. Description of the Related Art

A terahertz band is useful with respect to applications of molecular optics, biological physics, medical science, spectroscopy, image processing appliances, and security appliances. Though the terahertz ($10^{12}$ Hz) band ranges from the microwave band to the optical band, there are only a few currently developed oscillators and amplifiers operating with respect to the terahertz band due to various physical and engineering limitations. Recently, such terahertz band oscillators or amplifiers have been developed by using diverse new concepts and an advance in micro processing technology.

A variety of approaches have been attempted to increase the frequency at which existing microwave band oscillators operate or to lower the operating frequency of oscillators operating within a higher frequency band to be within a terahertz band by using optical instruments such as a semiconductor laser or a femtosecond laser. Furthermore, various attempts have been made to fabricate a compact size terahertz oscillator.

Among the attempts, there has been developed a method of forming a three-dimensional (3D) microstructure on a substrate by using MEMS technology.

In particular, in a structure having a step height of 100 to 1,000 μm, because etching plasma, such as by way of deep reactive-ion etching (DRIE), may not uniformly permeate into the deep step, desired precision and uniformity may not be achieved. On an etched bottom surface, an etching rate is different near edges, generating a radius of curvature.

In addition, etching rate changes with depth, making it difficult to accurately perform etching to a desired depth. Moreover, an edge may have a radius of curvature, increasing a deviation in depth in the etched bottom surface. This phenomenon becomes more serious as etching depth increases.

SUMMARY

Provided is a microelectromechanical system (MEMS) device manufactured by using a substrate having different etching depths to prevent or reduce a depth deviation in an etched bottom surface and a radius of curvature of an edge, which may occur as etching depth increases during manufacturing of the MEMS device. Provided also is a terahertz oscillator using the MEMS device.

Provided is a method of manufacturing the MEMS device.

In accordance with example embodiments of inventive concepts, a microelectromechanical system (MEMS) may include a first structure. The first structure may include a first substrate and a second substrate. The first substrate may have first and second surfaces that face each other, a via etching hole pattern penetrating the first surface and the second surface and a first non-via etching hole pattern penetrating the first surface. The second substrate may be bonded to the first substrate and the second substrate may have third and fourth surfaces that face each other. In example embodiments of inventive concepts, the second substrate may include a second non-via etching hole pattern penetrating the third surface in a position corresponding to the via etching hole pattern of the first substrate.

In example embodiments of inventive concepts, a method of manufacturing a structure may include providing a first substrate including a first surface and a second surface that face each other, forming a via etching hole pattern that penetrates the first surface and the second surface and forming a first non-via etching hole pattern on the first surface. The method may further include providing a second substrate having a third surface and a fourth surface that face each other, forming a second non-via etching hole pattern on the third surface in a position corresponding to the via etching hole pattern, and bonding the second surface of the first substrate to the third surface of the second substrate.

In example embodiments of inventive concepts, a microelectromechanical system (MEMS) may include a first substrate with a first non-via etching hole pattern and a second substrate on the first substrate. The second substrate may include a second non-via etching hole pattern and a first via etching hole pattern. The MEMS may further include a third substrate on the second substrate. The third substrate may include a second via etching hole pattern and a third non-via etching hole pattern. The MEMS may further include a fourth substrate on the third substrate. The fourth substrate may include a fourth non-via etching hole pattern, wherein the first non-via etching hole pattern, the first via etching hole pattern, the second via etching hole pattern, and the fourth non-via etching hole pattern are arranged to form a first cavity and the second non-via etching hole pattern and the third non-via etching hole pattern are arranged to form a second cavity.

Additional aspects will be set forth in part in the description which follows and, in part, will be apparent from the description, or may be learned by practice of example embodiments of inventive concepts.

According to example embodiments of inventive concepts, a microelectromechanical system (MEMS) device may include a first structure and a second structure. The first structure may include a first substrate having a first surface and a second surface that face each other. The first structure may include a via etching hole pattern penetrating the first surface and the second surface. The first structure may also include a first non-via etching hole pattern on the first surface. The second substrate may include a third surface and a fourth surface that face each other. The second substrate may include a second non-via etching hole pattern on the third surface in a position corresponding to the via etching hole pattern of the first substrate. In example embodiments of inventive concepts, the first structure may be formed by bonding the second surface of the first substrate to the third surface of the second substrate.

In example embodiments of inventive concepts, a third non-via etching hole pattern may be formed by coupling the via etching hole pattern of the first substrate with the second non-via etching hole pattern of the second substrate.

The example MEMS device may further include a second structure formed in the same manner as the first structure, in which the MEMS device is formed by bonding the first surface of the first substrate of the first structure to a first surface of a first substrate of the second substrate.

The third non-via etching hole pattern of the first structure and a third non-via etching hole pattern of the second structure may be coupled by bonding the first structure to the second structure, thereby forming a coupled cavity.

The first non-via etching hole pattern of the first structure and a first non-via etching hole pattern of the second structure may be coupled by bonding the first structure to the second structure, thereby forming a wave guide.

For example, the MEMS device may be an interaction circuit or a terahertz oscillator.

A depth of the second non-via etching hole pattern of the second substrate may be, for example, ½ times or less than a depth of the third non-via etching hole pattern.

According to example embodiments of inventive concepts, a method of manufacturing a structure may include providing a first substrate including a first surface and a second surface that face each other. The method may include forming a via etching hole pattern that penetrates the first surface and the second surface and may include forming a first non-via etching hole pattern on the first surface. The method may further include providing a second substrate including a third surface and a fourth surface that face each other, forming a second non-via etching hole pattern on the third surface in a position corresponding to the via etching hole pattern, and bonding the second surface of the first substrate to the third surface of the second substrate.

The forming of the via etching hole pattern and the forming of the first non-via etching hole pattern may include forming a first mask pattern on the second surface of the first substrate, etching the second surface of the first substrate to a predetermined or preset depth by using the first mask pattern as an etching mask to form a part of the via etching hole pattern, filling an etching buffer material in an etched portion of the first substrate, forming a second mask pattern on the first surface of the first substrate, etching the first surface of the first substrate to a predetermined or preset depth by using the second mask pattern as an etching mask to form the via etching hole pattern and the first non-via etching hole pattern, removing the etching buffer material filled in the via etching hole pattern, and forming a metal thin film on the first surface, the second surface, and an etched surface of the first substrate.

The forming of the second non-via etching hole pattern may include forming a third mask pattern on a third surface of the second substrate, etching the third surface of the second substrate by using the third mask pattern as an etching mask to form the second non-via etching hole pattern in the position corresponding to the via etching hole pattern of the first substrate, and forming the metal thin film on the third surface and an etched surface of the second substrate.

For example, the etching buffer material filled in a portion of the first substrate etched by using the first mask pattern as an etching mask may be a material that is etchable by an etchant at a rate that is lower than or equal to an etching rate of the first substrate.

The bonding of the second surface of the first substrate to the third surface of the second substrate may include bonding the metal thin film formed on the second surface of the first substrate to the metal thin film formed on the third surface of the second substrate by using thermo-compressive bonding.

The bonding of the second surface of the first substrate to the third surface of the second substrate may include forming a solder line pattern on the second surface of the first substrate, and bonding the solder line pattern formed on the second surface of the first substrate to the metal thin film formed on the third surface of the second substrate by eutectic-bonding.

The forming of the first mask pattern may include forming an oxide film on the second surface of the first substrate, forming a photoresist layer on the second surface of the first substrate where the oxide film is formed, and forming the first mask pattern on the second surface where the oxide layer and the photoresist layer is formed.

The forming of the second mask pattern may include forming an oxide film on the first surface of the first substrate, forming a photoresist layer on the first surface of the first substrate wherein the oxide film is formed, and forming the second mask pattern on the first surface where the oxide film and the photoresist layer are formed.

The forming of the third mask pattern may include applying a photoresist layer on the third surface of the second substrate and forming the third mask pattern for the second non-via etching hole pattern on the third surface of the second substrate in a position corresponding to the via etching hole pattern of the first substrate.

The method may further include forming a first align key pattern on the second surface of the first substrate and forming a second align key pattern on the fourth surface of the second substrate.

In the bonding of the second surface of the first substrate to the third surface of the second substrate, the first substrate and the second substrate may be aligned with each other by using a first align key pattern formed on the first substrate and a second align key pattern formed on the second substrate, and may be bonded by using silicon (Si) direct bonding, oxide film bonding, eutectic bonding, or thermo-compressive bonding.

According to example embodiments of inventive concepts, a method of manufacturing an MEMS device may include forming a first structure by using the above-described method, forming a second structure by using the above-described method, and bonding a first surface of a first substrate of the first structure to a first surface of a first substrate of the second structure.

BRIEF DESCRIPTION OF THE DRAWINGS

Example embodiments of inventive concepts will be more clearly understood from the following detailed description taken in conjunction with the accompanying drawings. FIGS. 1-8 represent non-limiting, example embodiments of inventive concepts as described herein.

DETAILED DESCRIPTION

Example embodiments of inventive concepts will now be described more fully with reference to the accompanying drawings, in which example embodiments of inventive concepts are shown. The invention may, however, be embodied in different forms and should not be construed as limited to the embodiments set forth herein. Rather, example embodiments of inventive concepts are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments of inventive concepts.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of inventive concepts described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts.

Reference will now be made in detail to example embodiments of inventive concepts, examples of which are illustrated in the accompanying drawings, wherein like reference numerals refer to the like elements throughout and the size of each element may be exaggerated for clarity and convenience of explanation.

Figure 1:
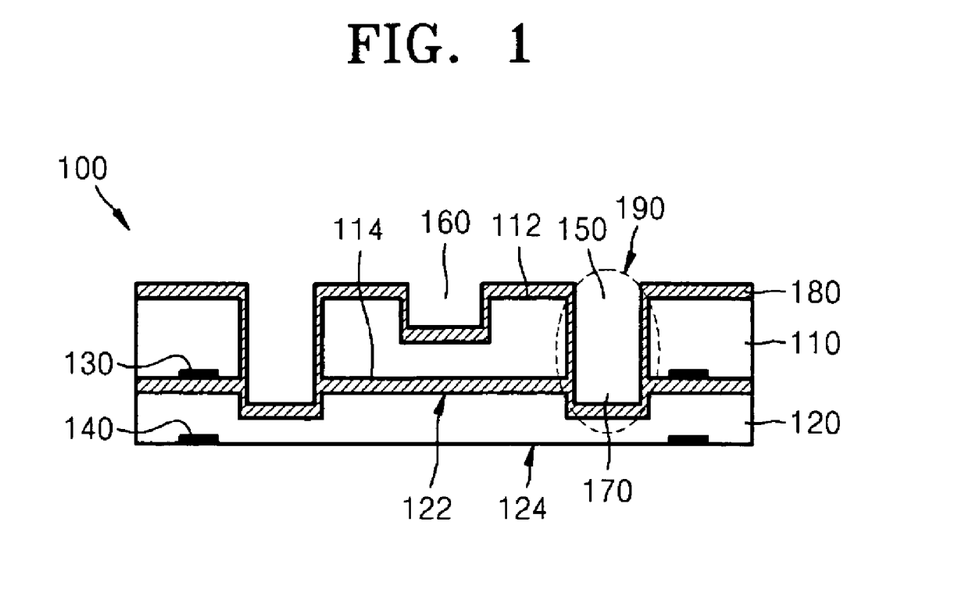
FIG. 1 is a cross-sectional view of a first structure according to example embodiments of inventive concepts.
Figure 2:
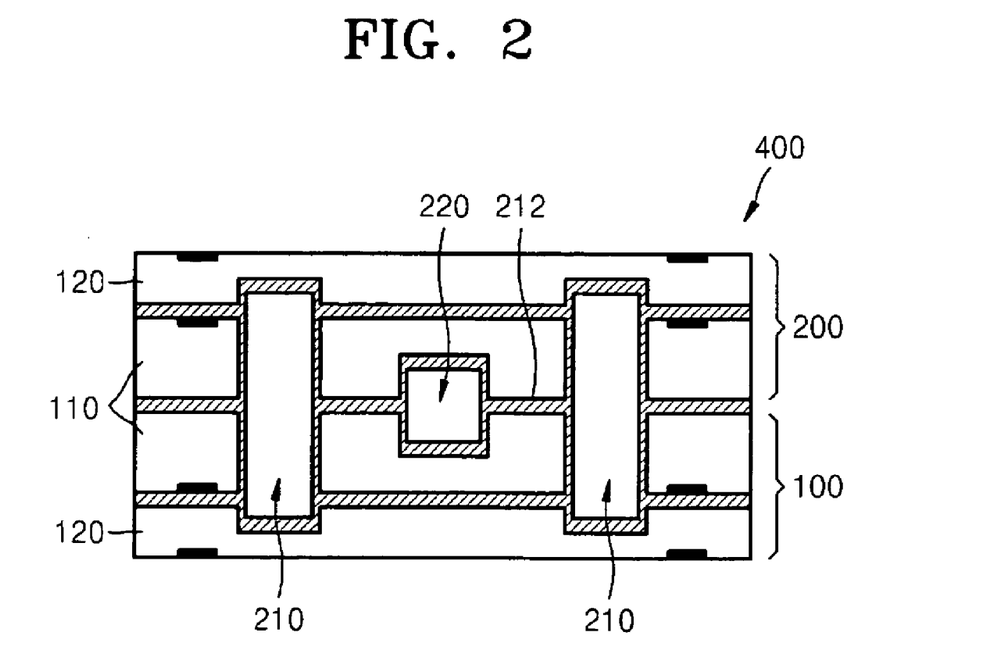
FIG. 2 is a cross-sectional view of a microelectromechanical system (MEMS) device according to example embodiments of inventive concepts.

FIG. 1 is a schematic cross-sectional view of a first structure 100, and FIG. 2 is a cross-sectional view of a microelectromechanical system (MEMS) device (or an interaction circuit) 400 manufactured by bonding the first structure 100 shown in FIG. 1 to another first substrate that may be formed in the same manner as the first structure 100 (which will hereinafter be referred to as a second structure 200).

The first structure 100 shown in FIG. 1 may include a first substrate 110 and a second substrate 120. The first substrate 110 may include a first surface 112 and a second surface 114 that face each other. The first substrate 110 may further include a via etching hole pattern 150 penetrating the first surface 112 and the second surface 114, and a first non-via etching hole pattern 160 formed on the first surface 112. As shown in FIG. 1, the via etching hole pattern 150 may be formed in two side portions of the first substrate 110, and the first non-via etching hole pattern 160 may be formed between the via etching hole patterns 150.

The second substrate 120 may include a third surface 122 and a fourth surface 124 that face each other. The second substrate 120 may further include a second non-via etching hole pattern 170 formed on the third surface 122. The second non-via etching hole pattern 170 may be formed on the third surface 122 of the second substrate 120 in such a position as to correspond to the via etching hole pattern 150 formed in the first substrate 110. As shown in FIG. 1, the first structure 100 may be formed by bonding the second surface 114 of the first substrate 110 to the third surface 122 of the second substrate 120. By bonding the first substrate 110 to the second substrate 120, a third non-via etching hole pattern 190 may be formed by coupling together the via etching hole pattern 150 of the first substrate 110 with the second non-via etching hole pattern 170 of the second substrate 120.

An MEMS device including the first structure 100 may be manufactured as shown in FIG. 2. The MEMS device 400 shown in FIG. 2 may include the second structure 200, which may be formed in the same manner as the first structure 100. The MEMS device 400 may be formed by bonding the first surface 112 of the first structure 100 to a first surface 212 of the second structure 200.

In example embodiments of inventive concepts, the first structure 100 may be bonded to the second structure 200 and the third non-via etching hole patterns 190 of the first structure 100 and the second structure 200 may be coupled together to form a first wave guide (or a coupled cavity) 210. In addition, the second non-via etching hole patterns 160 of the first structure 100 and the second structure 200 may be coupled together to form a second wave guide 220, that is, a single tunnel, that may serve as an electron beam tunnel in an interaction circuit.

The MEMS device 400 may be used, for example, as an interaction circuit or a terahertz oscillator for electromagnetic waves having wavelengths of millimetres or less.

A depth of the second non-via etching hole pattern 170 of the second substrate 120 may be, for example, about ½ times or less than a depth of the via etching hole pattern 150 of the first substrate 110. According to example embodiments of inventive concepts, the depth of the second non-via etching hole pattern 170 of the second substrate 120 may be, for example, ½ times or less than the depth of the third non-via etching hole pattern 190 formed by coupling/bonding the via etching hole pattern 150 of the first substrate 110 and the second non-via etching hole pattern 170 of the second substrate 120.

To obtain the third non-via etching hole pattern 190 having a desired depth, the via etching hole pattern 150 of the first substrate 110 may be formed to a depth equal to a substrate thickness of the first substrate 110 and the remaining depth of the third non-via etching hole pattern 190 may be formed with the second non-via etching hole pattern 170 of the second substrate 120. The second non-via etching hole pattern 170 may be etched to depth corresponding to a depth deviation in an etched bottom surface possible in a target MEMS device.

By using at least two substrates having different etching depths in manufacturing of the third non-via etching hole pattern 190, it is possible to solve problems such as a depth deviation in an etched bottom surface and a radius of curvature of an edge, which may occur as etching depth increases. In example embodiments of inventive concepts, as an etching depth of the second non-via etching hole pattern 170 decreases, the evenness of the etched bottom surface may increase, thereby obtaining a terahertz oscillator that may perform at an operating frequency more accurately/precisely.

FIGS. 3A through 3G are views for explaining a method of manufacturing the first substrate 110 according to example embodiments of inventive concepts.

Figure 3A:
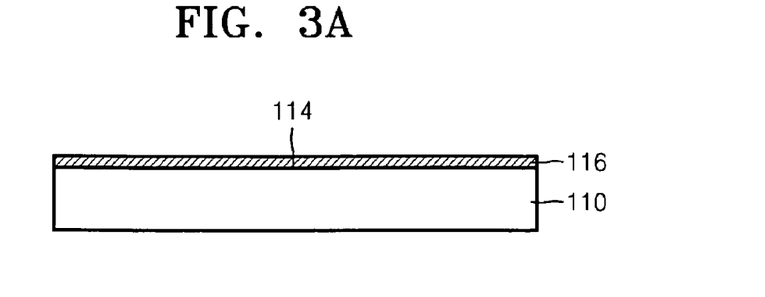
FIGS. 3A through 3G are views for explaining a method of manufacturing a first substrate of a first structure according to example embodiments of inventive concepts.
Figure 3B:
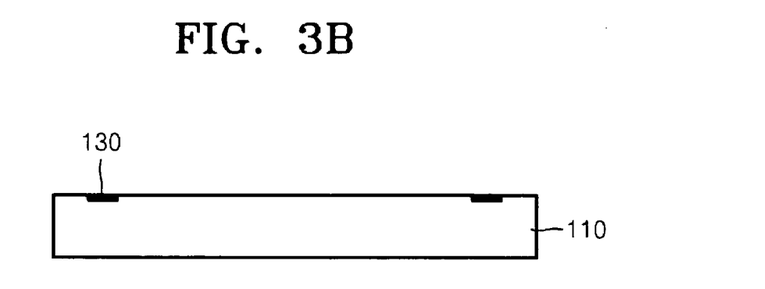

The method of manufacturing the first substrate 110 according to example embodiments of inventive concepts may include providing the first substrate 110 having the first surface 112 and the second surface 114 that face each other. In example embodiments of inventive concepts a photoresist layer 116 may be formed on the second surface 114 of the first substrate 110 through photoresist (PR) coating as shown in FIG. 3A. Additionally, a first align key pattern 130 may be formed on the second surface 114 by using the photoresist layer 116 and the remaining photoresist layer 116 may be removed as shown in FIG. 3B. The first align key pattern 130 may formed by etching the second surface 114 of the first substrate 110 or by stacking a metal or other materials on the second surface 114 of the first substrate 110. For example, the first align key pattern 130 has a cross shape, but example embodiments of inventive concepts are not limited thereto. This first align key pattern 130 may be used in processes where two or more structures are bonded with each other and is well-known in the art. Therefore, for the sake of brevity, a detailed explanation regarding the first align key pattern 130 is omitted.

Figure 3C:
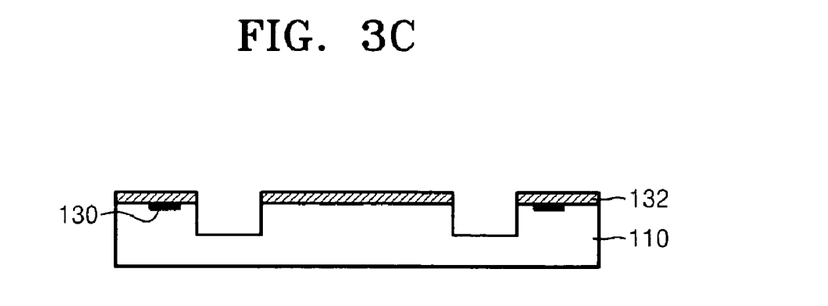
Figure 3D:
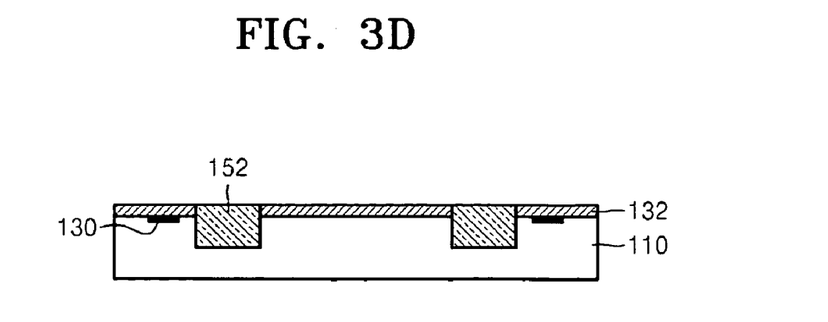
Figure 3E:
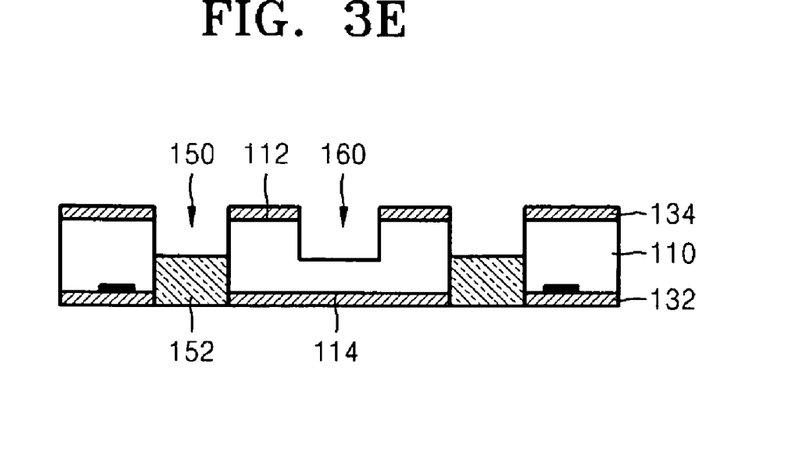
Figure 3F:
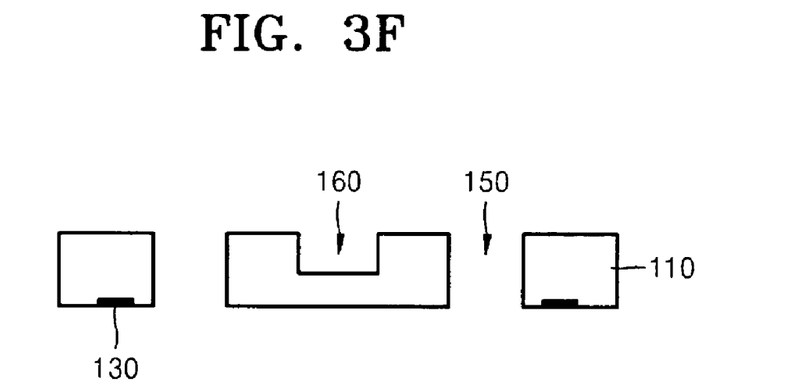
Figure 3G:
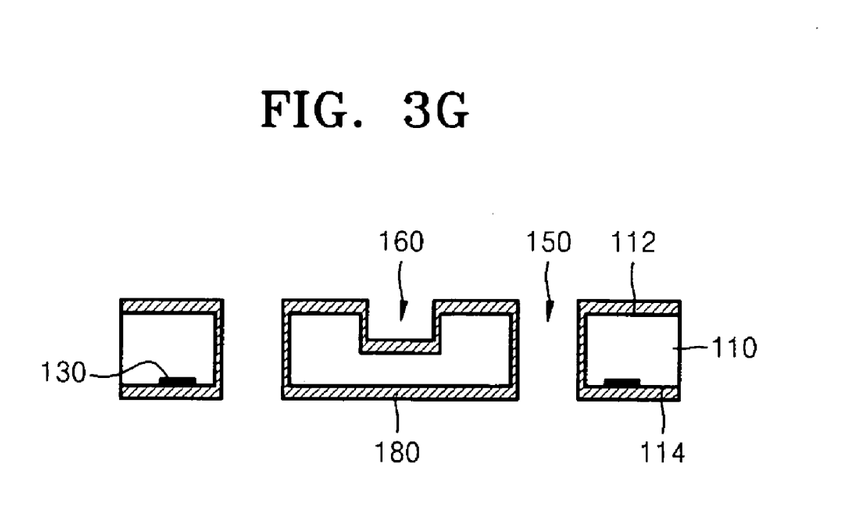

A first mask pattern 132 for the via etching hole pattern 150 may be formed by applying a photoresist layer onto the second surface 114 of the first substrate 110. A part of the via etching hole pattern 150 may be formed through etching. The etching hole pattern 150 may be formed to a first depth by using the first mask pattern 132 as an etching mask as shown in FIG. 3C. In example embodiments of inventive concepts, the first depth may or may not be predetermined. In example embodiments of inventive concepts an etching buffer material 152 may fill an etched portion as shown in FIG. 3D. A second mask pattern 134 may be formed on the first surface 112 of the first substrate 110 as shown in FIG. 3E for forming the via etching hole pattern 150 and the first non-via etching hole pattern 160. The via etching hole pattern 150 may be formed and the first non-via etching hole pattern 160 may be formed through etching. The via etching hole pattern 150 and the first non-via etching hole pattern 160 may be formed to a second depth by using the second mask pattern 134 as an etching mask and removing the second mask pattern 134 on the first surface 112 and the etching buffer material 152 filled in the via etching hole pattern 150 as shown in FIG. 3F. In example embodiments of inventive concepts the second depth may or may not be a predetermined depth. In example embodiments of inventive concepts, a metal thin film 180 may be formed on the first surface 112, the second surface 114, and the etched surfaces of the first substrate 112 as shown in FIG. 3G.

FIG. 3B shows the first substrate 110 where the first align key pattern 130 is formed. The first align key pattern 130 may be used to precisely bond the first substrate 110 with another substrate or another structure. The first align key pattern 130 may also be used to adjust an etching position on another substrate or another surface. For example, the second mask pattern 134 shown in FIG. 3E may be aligned with the first align key pattern 130 on the second surface 114 of the first substrate 110 to adjust an etching position on the second surface 114.

The etching buffer material 152 may fill the portion of the first substrate 110 etched with the first mask pattern 132. The etching buffer material 152 may be a material that may be etched with an etchant at a rate that is lower than or equal to an etching rate of the first substrate 110. For example, the etching buffer material 152 may be a material such as a photoresist, whereby when a portion of the via etching hole pattern 150 in the second surface 114 is etched by using the first mask pattern 132 as shown in FIG. 3C and the first substrate 110 is turned over to etch the first non-via etching hole 160 and the via etching hole pattern 150 in the first surface 112 as shown in FIG. 3E, the via etching hole pattern 150 is perforated, thus adjusting an etching rate with the use of the etching buffer material 152 and preventing a notch from being generated in an etched surface. The formation of the metal thin film 180 as shown in FIG. 3G may be performed by using, for example, a sputtering or plating method.

Figure 4A:
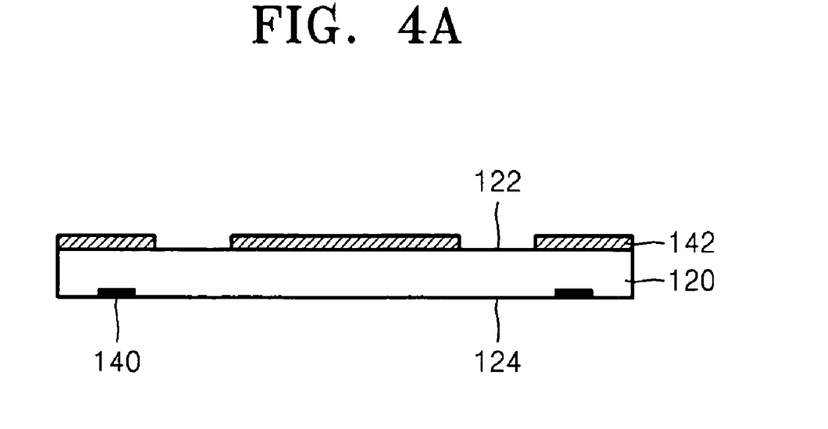
FIGS. 4A through 4C are views for explaining a method of manufacturing a second substrate of a first structure according to example embodiments of inventive concepts.
Figure 4B:
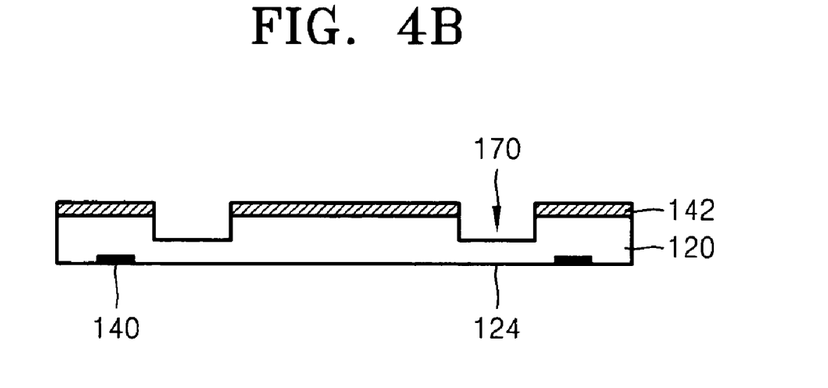
Figure 4C:
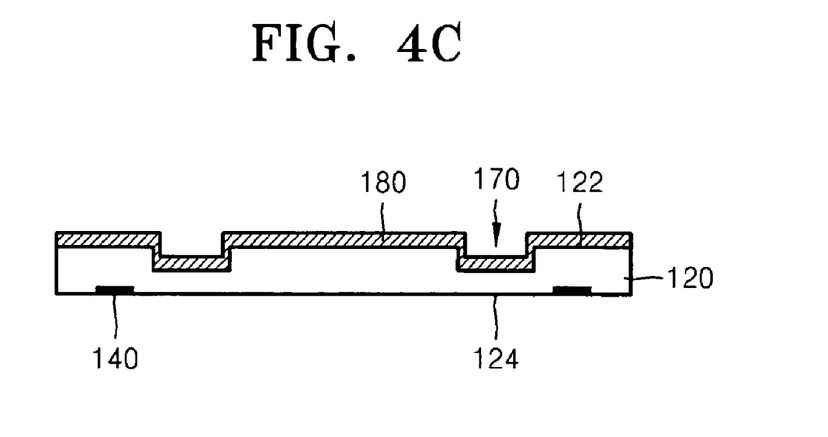

FIGS. 4A through 4C are views for explaining a method of manufacturing the second substrate 120 according to example embodiments of inventive concepts.

The method of manufacturing the second substrate 120 according to example embodiments of inventive concepts may include providing the second substrate 120 having the third surface 122 and the fourth surface 124, that face each other. In accordance with example embodiments of inventive concepts, a photoresist layer may be formed on the fourth surface 124 of the second substrate 120 through PR coating, like in FIG. 3A, to form a second align key pattern 140 (shown in FIG. 4A), and the photoresist layer may be removed like in FIG. 3B. Another photoresist layer may be applied onto the third surface 122 of the second substrate 120 and a third mask pattern 142 for forming the second non-via etching hole pattern 170 in a position corresponding to the via etching hole pattern 150 of the first substrate 110 as shown in FIG. 4A may be formed. In example embodiments of inventive concepts, the second non-via etching hole pattern 170 may be formed through etching to a desired depth by using the third mask pattern 142 as an etching mask as shown in FIG. 4B. In example embodiments of inventive concepts, the desired depth may or may not be predetermined. Additionally, as shown in FIG. 4C, a metal thin film 180 may be formed on the third surface 122 and the etched surfaces of the second substrate 120.

In accordance with example embodiments of inventive concepts, to form the second non-via etching hole pattern 170 on the second substrate 120, the third mask pattern 142 may be identical to the first mask pattern 132.

In FIG. 4B, the depth of the second non-via etching hole pattern 170 may be ½ times or less than the depth of the third non-via etching hole pattern 190, which may be formed by coupling/bonding the via etching hole pattern 150 of the first substrate 110 to the second non-via etching hole pattern 170 of the second substrate 120 in corresponding positions. The second non-via etching hole pattern 170 may be etched to such a depth as to obtain an even bottom surface.

When a via etching hole pattern or a non-via etching hole pattern is formed in a substrate, it may be etched by using a photoresist mask as shown in FIGS. 3A through 3G and FIGS. 4A through 4C, or by using an oxide layer as a mask as shown in FIGS. 5A through 5G. FIGS. 5A through 5G are views for explaining a method of manufacturing the first substrate 110 according to example embodiments of inventive concepts, wherein a photoresist layer and an oxide film are used as a first mask or a second mask.

Figure 5A:
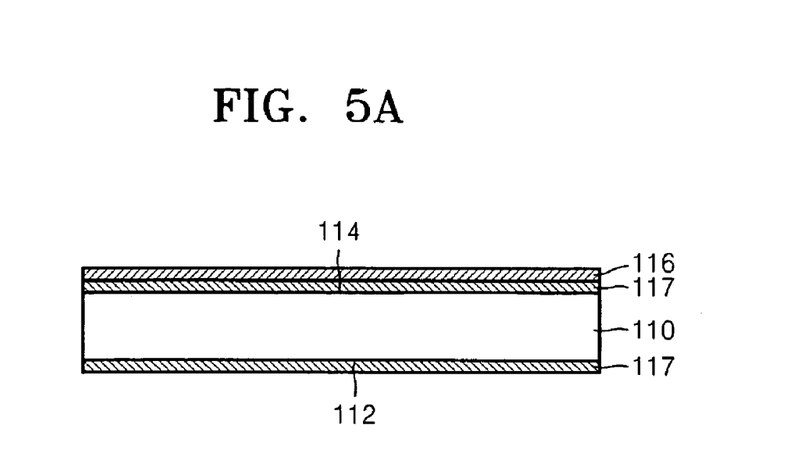
FIGS. 5A through 5G are views for explaining a method of manufacturing a first substrate of a first structure according to example embodiments of inventive concepts.
Figure 5B:
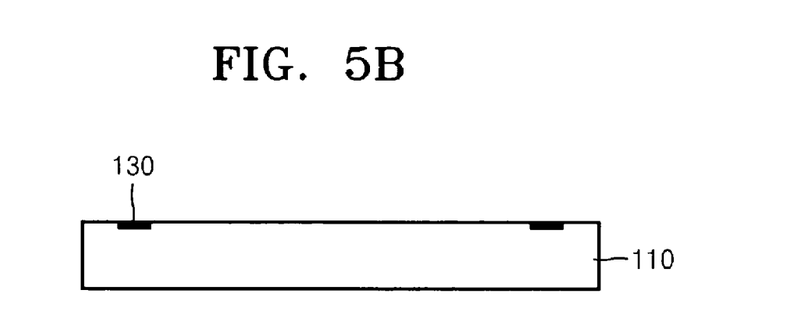
Figure 5C:
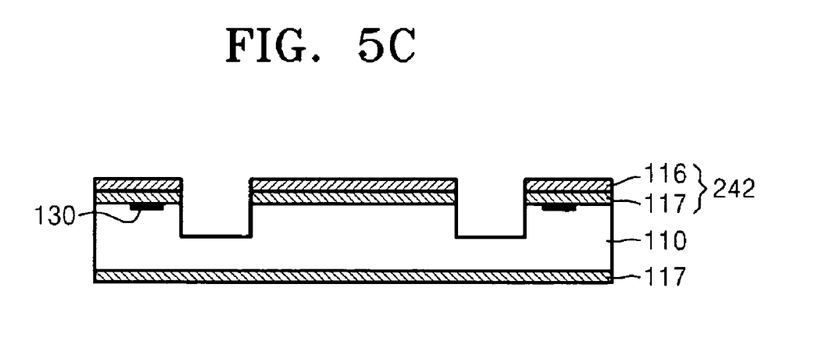
Figure 5D:
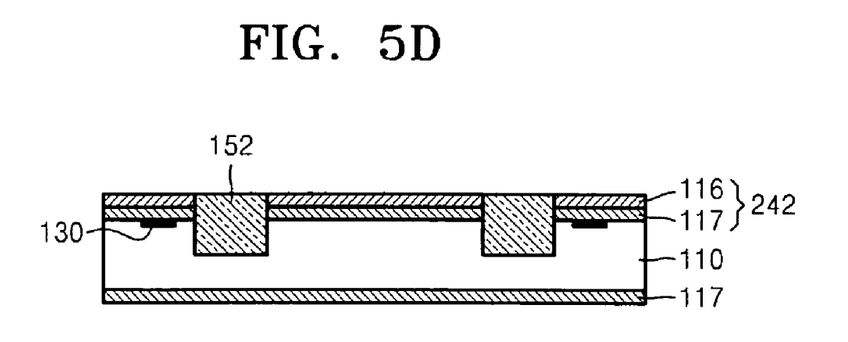
Figure 5E:
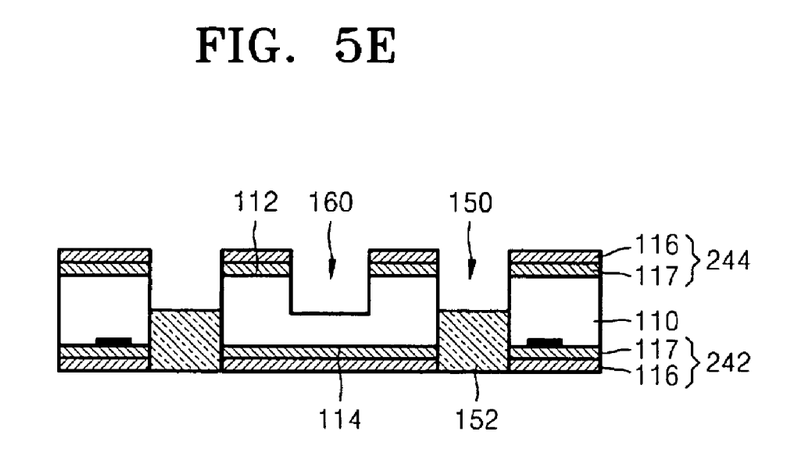
Figure 5F:
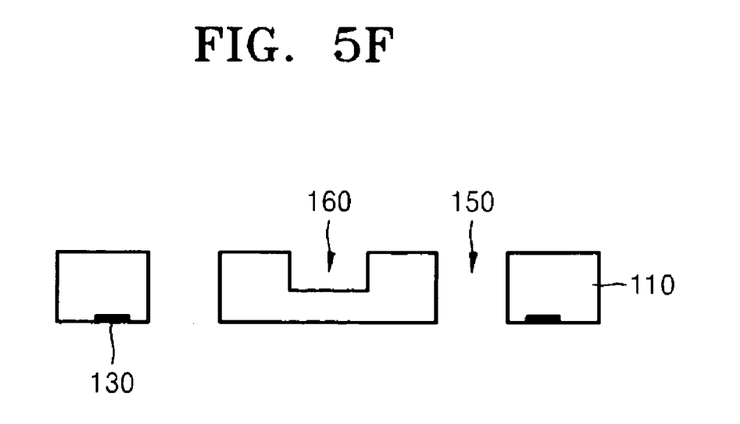

A method of manufacturing a first substrate 110 according to example embodiments of inventive concepts may include providing the first substrate 110 having a first surface 112 and a second surface 114, that face each other. In example embodiments of inventive concepts an oxide film layer 117 may be formed on the first surface 112 and the second surface 114 and a photoresist layer 116 may be formed on the oxide film layer 117 formed on the second surface 114 as shown in FIG. 5A. In example embodiments of inventive concepts, the first align key pattern 130 may be formed on the second surface 114 by using the photoresist layer 116 and the oxide film layer 117 and then removing the photoresist layer 116 and the oxide film layer 117 as shown in FIG. 5B. The method may further include forming a first mask pattern 242 for forming the via etching hole pattern 150 by applying a photoresist layer 116 onto the second surface 114 of the first substrate 110 again as shown in FIG. 5O, etching a portion of the first substrate 110, and filling the etched portion of the first substrate 110, as shown in FIG. 5D, with an etching buffer material 152. The method may further include forming a second mask pattern 244 for the via etching hole pattern 150 and the first non-via etching hole pattern 160. The second mask pattern 244 may be formed by forming a photoresist layer 116 on the oxide film layer 117 formed on the first surface 112 of the first substrate 110 and forming the via etching hole pattern 150 and the first non-via etching hole pattern 160 by etching the first substrate 110 to a desired depth by using the second mask pattern 244 as an etching mask as shown in FIG. 5E. In example embodiments of inventive concepts the desired depth may or may not be predetermined. The method may further include removing the photoresist layers 116, the oxide film layers 117, and the etching buffer material 152 filled in the via etching hole pattern 150 as shown in FIG. 5F. The method may also include forming a metal thin film 180 on the first surface 112, the second surface 114, and the etched surface of the first substrate 110. In example embodiments of inventive concepts, the oxide film layer 117 may be formed of, for example, a silicon oxide (SiO₂) film. When a part of the via etching hole pattern 150 is formed in the second surface 114 of the first substrate 110 and the first substrate 110 is turned over to form the remaining part of the via etching hole pattern 150 in the first surface 112, the via etching hole patterns 150 formed in the first surface 112 and the second surface 114 may be aligned with each other by using the first align key pattern 130 formed on the second surface 114.

Figure 6:
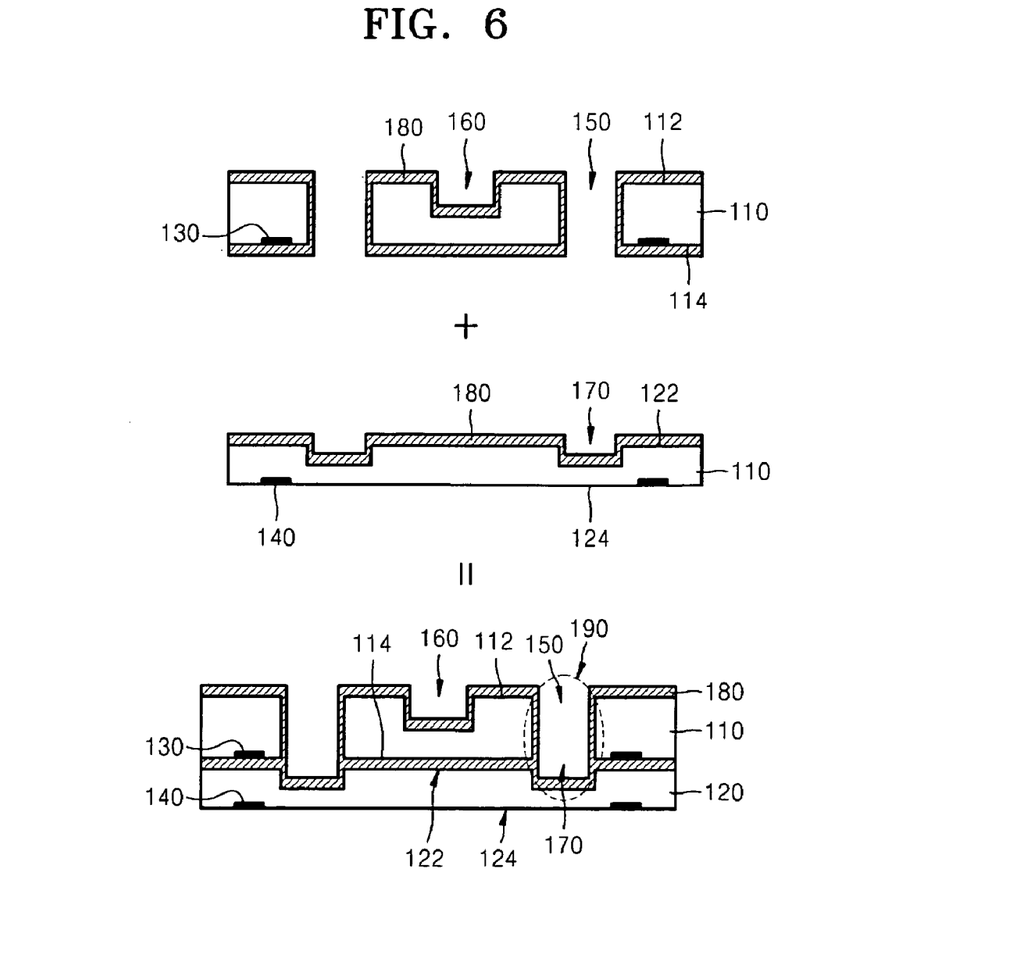
FIG. 6 is a view for explaining a method of manufacturing a first structure according to example embodiments of inventive concepts.

FIG. 6 is a view for explaining a method of manufacturing the first structure 100 according to example embodiments of inventive concepts.

The method of manufacturing the first structure 100 according to example embodiments of inventive concepts may include manufacturing the first substrate 110 as shown in FIGS. 3A through 3G or as shown in FIGS. 5A through 5G, manufacturing the second substrate 120 as shown in FIGS. 4A through 4C, and bonding the second surface 114 of the first substrate 110 with the third surface 122 of the second substrate 120 as shown in FIG. 6.

Figure 5G:
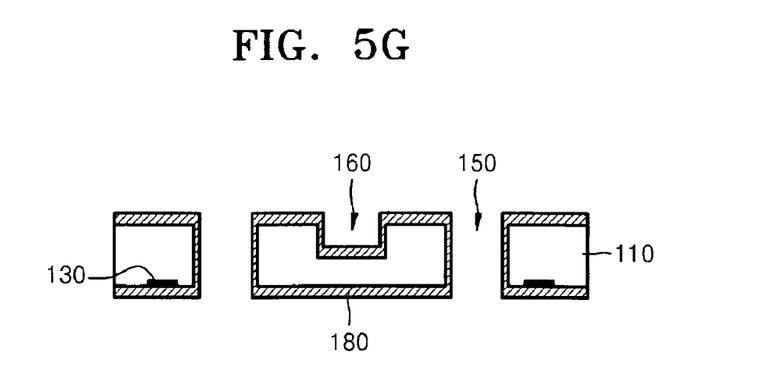

In example embodiments of inventive concepts, a method of bonding the first substrate 110 to the second substrate 120 is shown in FIG. 6. As shown in FIG. 6, the method may include forming the metal thin film 180 on the first surface 112, the via etching hole pattern 150, and the first non-via etching hole pattern 160 of the first substrate 110. The method may further include forming the metal thin film 180 on the third surface 122 and the second non-via etching hole pattern 170 of the second substrate 120. The method may further include forming the metal thin film 180 on the second surface 114 of the first substrate 110 and bonding the second surface 114 of the first substrate 110 to the third surface 122 of the second substrate 120, for example, by using thermo-compressive bonding. The forming of the metal thin film 180 on the first substrate 110 may have already been performed as shown in FIG. 3G or as shown in FIG. 5G. The forming of the metal thin film 180 on the second substrate 120 may have already been performed as shown in FIG. 4C.

Another way to bond the first substrate 110 to the second substrate 120 may include forming a solder line pattern (not shown) on the second surface 114 of the first substrate 110, and bonding the solder line pattern with the metal thin film 180 on the third surface 122 of the second substrate 120 via eutectic-bonding. The solder line pattern may be formed on the third surface 122 of the second substrate 122.

Figure 7A:
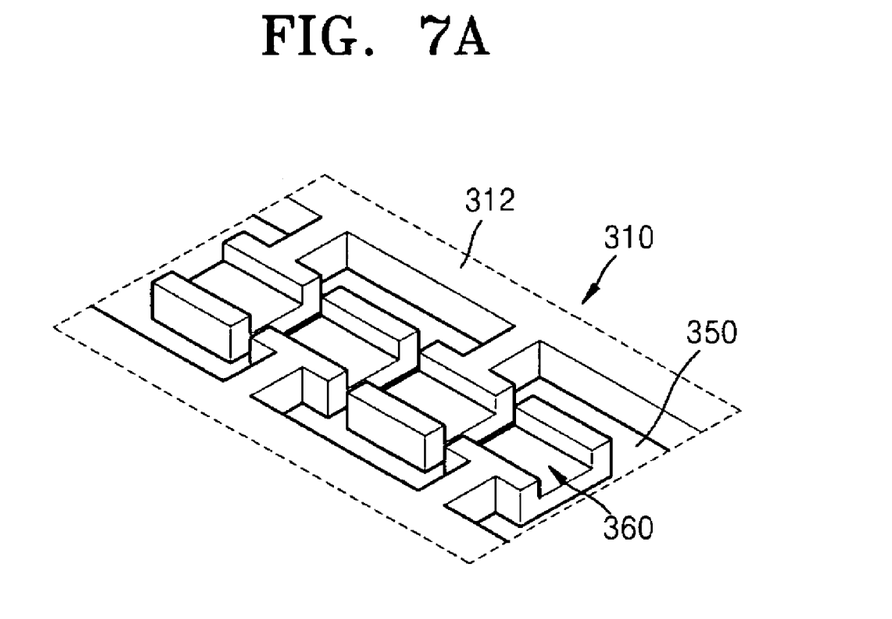
FIGS. 7A through 7C are three-dimensional perspective views showing a method of manufacturing a first structure according to example embodiments of inventive concepts.
Figure 7B:
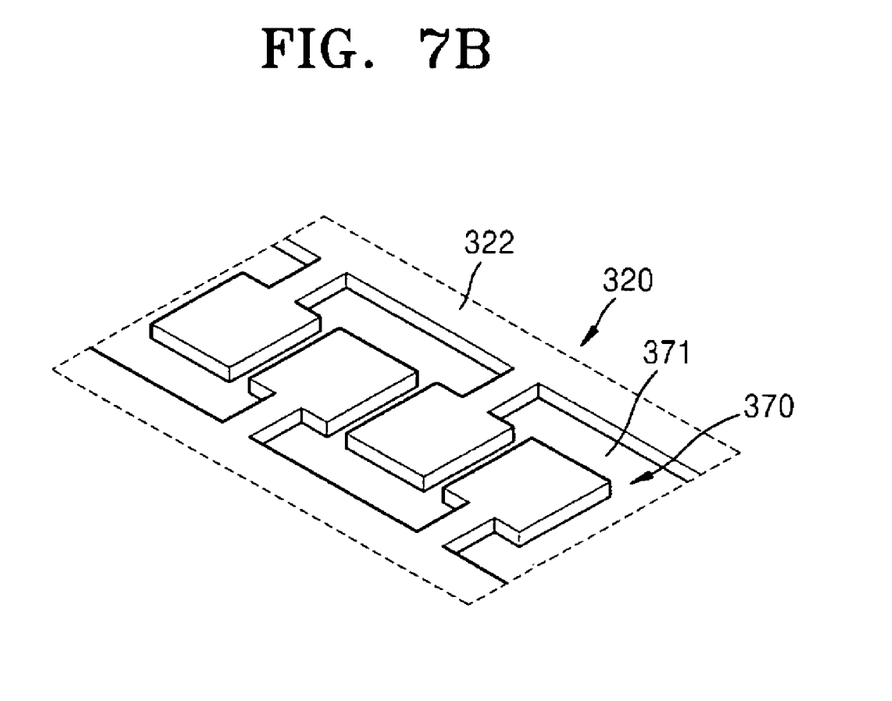
Figure 7C:
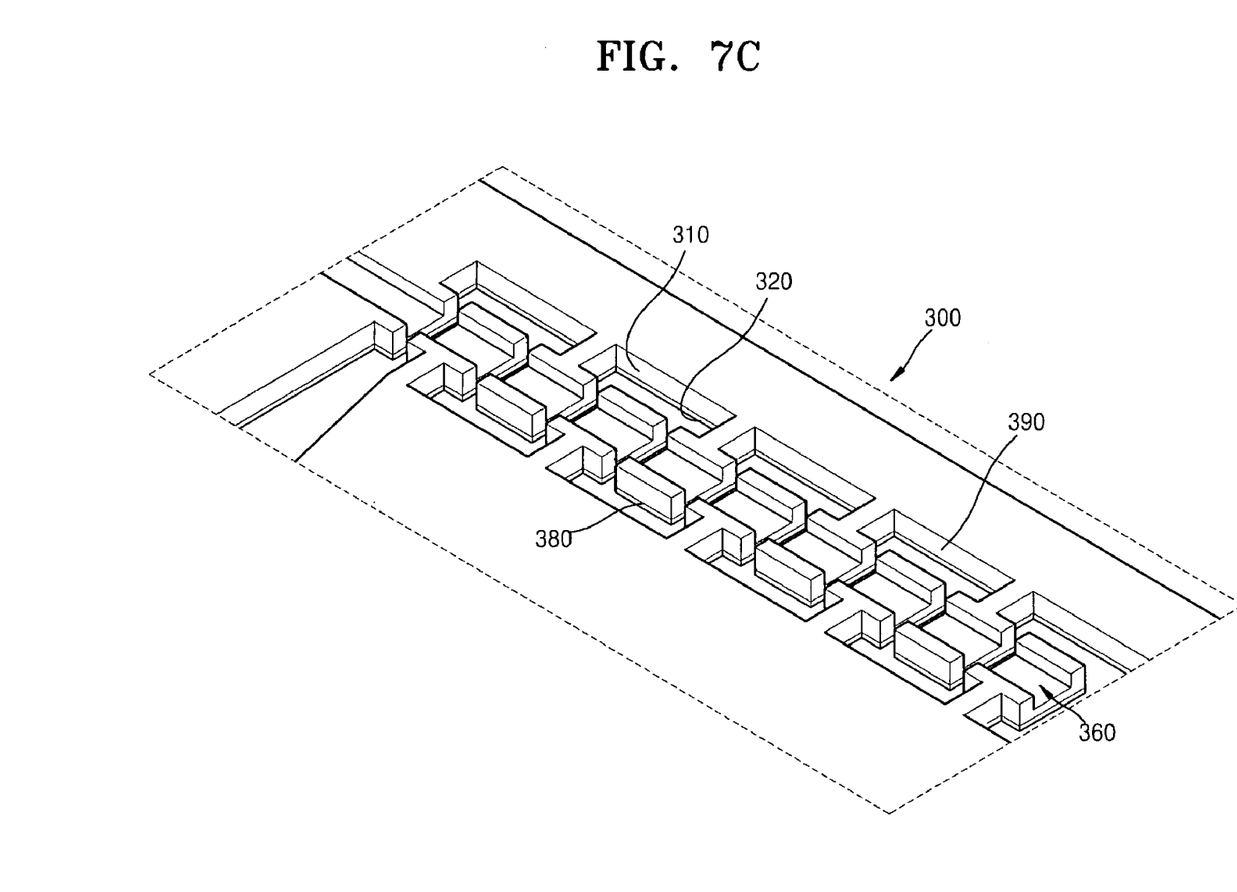

FIGS. 7A through 7C are perspective views for explaining a first structure 300 and a method of manufacturing the first structure 300 according to example embodiments of inventive concepts. FIG. 7A is a three-dimensional (3D) perspective view viewed from a first surface 312 of a first substrate 310, in which a via etching hole pattern 350 and a first non-via etching hole pattern 360 are shown. FIG. 7B is a 3D perspective view viewed from a third surface 322 of a second substrate 320, in which a second non-via etching hole pattern 370 and a bottom surface 371 thereof are shown. FIG. 7C is a 3D perspective view showing that a second surface of the first substrate 310 and a third surface 322 of the second substrate 320 are bonded. The first substrate 310 and the second substrate 320 may be bonded after being aligned with each other by using align keys (not shown) formed thereon. In FIG. 7C, a bonding interface 380 and a third non-via etching hole pattern 390 formed by bonding the first substrate 310 and the second substrate 320 may be seen. The bonding of the first substrate 310 and the second substrate 320 may be performed in various ways without particular restrictions. For example, the bonding may be performed by using silicon (Si) direct bonding, oxide film bonding, eutectic bonding, or thermo-compressive bonding.

Figure 8:
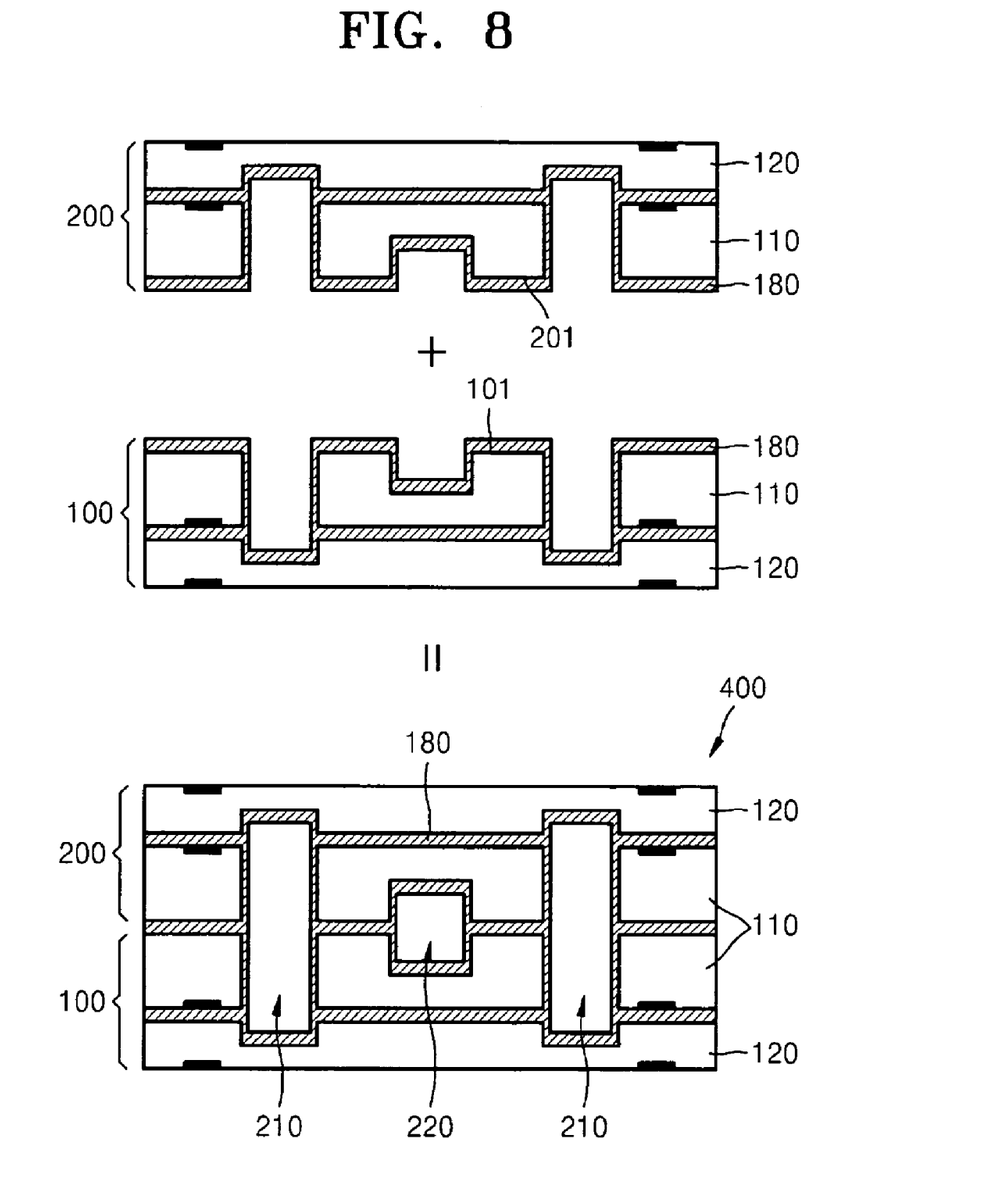
FIG. 8 is a view for explaining a method of manufacturing an MEMS device according to example embodiments of inventive concepts.

FIG. 8 includes views illustrating a method of manufacturing the MEMS device 400 according to example embodiments of inventive concepts. The MEMS device 400 as shown in FIG. 8 may be manufactured by bonding the first structure 100 to the second structure 200, which may be formed in the same manner as shown in FIG. 6. Although not shown in FIG. 8, the MEMS device 400 may also be manufactured by bonding two structures 300 formed in the same manner as shown in FIGS. 7A through 7C. When the first structure 100 and the second structure 200 are bonded as shown in FIG. 8, the third non-via etching hole patterns 190 of the first structure 100 and the second structure 200 are aligned thus forming the first wave guide (or the coupled cavity) 210. As the first non-via etching hole patterns 160 of the first structure 100 and the second structure 200 are bonded, the second wave guide 220 may also be formed. Thus formed MEMS device 400 may be used as a terahertz oscillator or amplifier. For example, when the MEMS device 400 is used as a terahertz oscillator, the second wave guide 220 may serve as an electron beam tunnel.

The method of manufacturing the MEMS device 400 shown in FIG. 8 may include forming the first structure 100 by bonding the first substrate 110 to the second substrate 120. The method may also include forming the second structure 200 by bonding the first substrate 110 to the second substrate 120. As shown in FIG. 8, a metal thin film 180 may be formed on a first surface 101 of the first structure 100, that is, the first surface 112 of the first substrate 110, and the metal thin film 180 may be formed on a first surface 201 of the second structure 200. In example embodiments of inventive concepts the metal thin films 180 on the first structure 100 and the second structure 200 may be bonded together by using, for example, thermo-compressive bonding. Alternatively, the method may include forming a metal thin film on any one of the first surface 101 of the first structure 100 and the first surface 201 of the second structure 200 and forming a solder line pattern (not shown) on the other surface, and eutectic-bonding the metal thin film and the solder line pattern.

The metal thin film 180 used to bond the first substrate 110 to the second substrate 120 or the first structure 100 and the second structure 200 may be formed of, for example, chromium (Cr) or titanium (Ti) and aurum (Au), and the solder line pattern (not shown) may be formed of one or more of Cr, Ti, nickel (Ni), Au, and stannum (Sn).

According to example embodiments of inventive concepts, three or more structures may be bonded in the foregoing manner, and the number of stages may be increased by using a plurality of substrates such as a third substrate, a fourth substrate, and more, thereby making various 3D structures.

The above-described separate etching and bonding of substrates according to example embodiments may be used to manufacture a terahertz oscillator or amplifier or a 3D MEMS device. By using the method according to example embodiments of inventive concepts, it is possible to maintain an even bottom surface after being etched, and to prevent or reduce an overhang structure from being generated due to a radius of curvature on the bottom surface or incomplete etching of the edge of a top surface of a step. Accordingly, etching quality may be improved, substrates may be exquisitely bonded by using align keys formed on the substrates, and a multi-layer process is possible.

It should be understood that the example embodiments of inventive concepts described therein should be considered in a descriptive sense only and not for purposes of limitation. Descriptions of features or aspects within example embodiments of inventive concepts should typically be considered as available for other similar features or aspects in other embodiments.

What is claimed is:

1. A microelectromechanical system (MEMS) comprising:
a first structure, the first structure including
a first substrate having first and second surfaces that face each other, the first substrate including a via etching hole pattern penetrating the first surface and the second surface and a first non-via etching hole pattern penetrating the first surface; and
a second substrate bonded to the first substrate, the second substrate having third and fourth surfaces that face each other, the second substrate including a second non-via etching hole pattern penetrating the third surface in a position corresponding to the via etching hole pattern of the first substrate,
wherein the MEMS further comprises metal thin films formed on the first surface, the second surface, the third surface, and etched surfaces of the via etching hole pattern of the first structure, the first non-via etching hole pattern of the first structure and the second non-via etching hole pattern of the first structure.

2. The MEMS of claim 1, wherein the via etching hole pattern of the first substrate is coupled with the second non-via etching hole pattern of the second substrate to form a third non-via etching hole pattern.

3. The MEMS of claim 2, further comprising:
a second structure, the second structure including
a first substrate having first and second surfaces that face each other, the first substrate of the second structure including a via etching hole pattern penetrating the first surface of the first substrate of the second structure and the second surface of the first substrate of the second structure and a first non-via etching hole pattern penetrating the first surface of the first substrate of the second structure; and
a second substrate bonded to the first substrate of the second structure, the second substrate of the second structure having third and fourth surfaces that face each other, the second substrate of the second structure including a second non-via etching hole pattern on the third surface of the second substrate of the second structure in a position corresponding to the via etching hole pattern of the first substrate of the second structure,
wherein the MEMS further comprises metal thin films formed on the first surface of the first substrate of the second structure, the second surface of the first substrate of the second structure, the third surface of the second substrate of the second structure, and etched surfaces of the via etching hole pattern of the first substrate of the second structure, the first non-via etching hole pattern of the first substrate of the second structure and the second non-via etching hole pattern of the second substrate of the second structure.

4. The MEMS of claim 3, wherein the via etching hole pattern of the first substrate of the second structure is coupled with the second non-via etching hole pattern of the second substrate of the second structure to form a third non-via etching hole pattern of the second structure and the third non-via etching hole pattern of the first structure and the third non-via etching hole pattern of the second structure are coupled together to form a coupled cavity.

5. The MEMS of claim 3, wherein the first non-via etching hole pattern of the first structure and the first non-via etching hole pattern of the second structure are coupled together to form a wave guide.

6. The MEMS of claim of claim 1, wherein the MEMS is one of an interaction circuit and a terahertz oscillator.

7. The MEMS of claim 2, wherein a depth of the second non-via etching hole pattern of the second substrate is ½ times or less than a depth of the third non-via etching hole pattern.

8. A method of manufacturing a structure, the method comprising:
  providing a first substrate including a first surface and a second surface that face each other;
  forming a via etching hole pattern that penetrates the first surface and the second surface and forming a first non-via etching hole pattern on the first surface;
  providing a second substrate having a third surface and a fourth surface that face each other;
  forming a second non-via etching hole pattern on the third surface in a position corresponding to the via etching hole pattern;
  bonding the second surface of the first substrate to the third surface of the second substrate; and
  forming metal thin films on the first surface, the second surface, the third surface, and etched surfaces of the via etching hole pattern, the first non-via etching hole pattern and the second non-via etching hole pattern.

9. The method of claim 8, wherein forming the via etching hole pattern and forming the first non-via etching hole pattern includes
  forming a first mask pattern on the second surface of the first substrate;
  etching a portion of the second surface of the first substrate to a first depth by using the first mask pattern as an etching mask to form a part of the via etching hole pattern;
  filling the etched portion of the first substrate with an etching buffer material;
  forming a second mask pattern on the first surface of the first substrate;
  etching the first surface of the first substrate to a second depth by using the second mask pattern as an etching mask to form the via etching hole pattern and the first non-via etching hole pattern;
  removing the etching buffer material filled in the via etching hole pattern; and
  forming the metal thin films on the first surface, the second surface, and the etched surfaces of the via etching hole pattern and the first non-via etching hole pattern.

10. The method of claim 9, wherein forming the second non-via etching hole pattern includes
  forming a third mask pattern on the third surface of the second substrate;
  etching the third surface of the second substrate by using the third mask pattern as an etching mask to form the second non-via etching hole pattern in a position corresponding to the via etching hole pattern of the first substrate; and
  forming the metal thin films on the third surface and the etched surfaces of the second non-via etching hole pattern.

11. The method of claim 9, wherein the etching buffer material has an etching rate that is lower than or equal to an etching rate of the first substrate.

12. The method of claim 10, wherein
  bonding the second surface of the first substrate to the third surface of the second substrate includes bonding the metal thin film formed on the second surface of the first substrate to the metal thin film formed on the third surface of the second substrate by using thermo-compressive bonding.

13. The method of claim 10, wherein
  bonding the second surface of the first substrate to the third surface of the second substrate includes eutectic-bonding the second surface of the first substrate with the metal thin film formed on the third surface of the second substrate.

14. The method of claim 8, further comprising:
  aligning the first substrate with the second substrate using a first align key pattern on the first substrate and a second align key pattern on the second substrate and;
  bonding the second surface of the first substrate to the third surface of the second substrate by using one of silicon (Si) direct bonding, oxide film bonding, eutectic bonding, and thermo-compressive bonding.

15. A microelectromechanical system (MEMS) comprising:
  a first substrate with a first non-via etching hole pattern;
  a second substrate on the first substrate, the second substrate including a second non-via etching hole pattern and a first via etching hole pattern;
  a third substrate on the second substrate, the third substrate including a second via etching hole pattern and a third non-via etching hole pattern; and
  a fourth substrate on the third substrate, the fourth substrate including a fourth non-via etching hole pattern, wherein the first non-via etching hole pattern, the first via etching hole pattern, the second via etching hole pattern, and the fourth non-via etching hole pattern are part of a same first cavity and the second non-via etching hole pattern and the third non-via etching hole pattern are part of a same second cavity.

16. The MEMS device of claim 15, further comprising:
  metal thin films between the first substrate and the second substrate, between the second substrate and the third substrate, and between the third substrate and the fourth substrate, wherein the metal thin films are configured to bond the first substrate to the second substrate, the second substrate to the third substrate, and the third substrate to the fourth substrate.

17. The MEMS device of claim 15, wherein the first and second cavities are lined by metal thin films.

18. The MEMS device of claim 15, further comprising:
  align key patterns on the first substrate, the second substrate, the third substrate and the fourth substrate.

19. The MEMS device of claim 18, wherein the align key patterns are arranged over one another.

* * * * *